United States Patent [19]

Holderfield et al.

[11] Patent Number: 4,962,355
[45] Date of Patent: Oct. 9, 1990

[54] THERMAL TEST CHAMBER DEVICE

[75] Inventors: Daron C. Holderfield, Boaz; Bernard E. Martin, Huntsville, both of Ala.; Samuel S. Russell, Irmo, S.C.

[73] Assignee: The United States of America as represented by the Secretary of the Army, Washington, D.C.

[21] Appl. No.: 263,306

[22] Filed: Oct. 27, 1988

[51] Int. Cl.$^5$ .................. G01R 35/00; G01R 31/26
[52] U.S. Cl. ........................ 324/158 F; 324/158 P
[58] Field of Search .......... 324/73 PC, 158 F, 158 P; 374/65, 57, 208; 73/865.6

[56] References Cited

U.S. PATENT DOCUMENTS

| | | | |
|---|---|---|---|
| 3,710,251 | 1/1973 | Hagge et al. | 324/158 F |
| 3,979,671 | 4/1976 | Meeker et al. | 324/158 F |
| 4,607,220 | 8/1986 | Hollman | 324/158 F |
| 4,787,752 | 11/1988 | Fraser et al. | 374/57 |
| 4,791,364 | 12/1988 | Kufis et al. | 324/158 F |
| 4,812,750 | 3/1989 | Keel et al. | 73/865.6 |

Primary Examiner—Reinhard J. Eisenzopf
Assistant Examiner—Vinh P. Nguyen
Attorney, Agent, or Firm—Freddie M. Bush; James T. Deaton

[57] ABSTRACT

A thermal test chamber device is provided that includes two half housing sections that are secured together to define a chamber there between with a window for viewing inside the chamber and with an inlet and an outlet for supplying and exhausting a medium to and from the chamber. The lower half housing section has an electrical circuit mounted relative thereto for testing a semiconductor chip specimen when presented relative thereto.

6 Claims, 2 Drawing Sheets

THERMAL TEST CHAMBER DEVICE

DEDICATORY CLAUSE

The invention described herein was made in the course of or under a contract or subcontract thereunder with the Government and by a Government employee and may be manufactured, used, and licensed by or for the Government for governmental purposes without the payment to us of any royalities thereon.

CROSS REFERENCE TO RELATED APPLICATION

This application is related to applicants' co-pending application Ser. Nos. 263,466, and 263.305, now U.S. Pat. Nos. 4,884,027 and 4,881,411 respectively Daron C. Holderfield, Bernard E. Martin, and Samuel S. Russell in that this invention is used in the system disclosed in application Ser. No. 263,466 and with the specific specimen holder and rotary assembly as disclosed in co-pending application Ser. No. 263,305 now U.S. Pat. No. 4,881,411 .

BACKGROUND OF THE INVENTION

In the past, a testing device has not been available by which a semiconductor chip can be tested under electrical and thermal conditions at the same time as needed. Under current semiconductor chip testing, reliability is determined using two industry standard methodologies: (a) wafer probing where an array of chips on a wafer are probed at room temperature; and (b) statistical sampling with thermal stress.

Wafer probing technology has been the accepted way for chip testing at room temperature. A wafer is usually four or five inches in diameter and contains an array of several chips of the same type. After probing, the wafer is scribed (cut) and separated and the individual chips are then available for use on the production floor. Wafer probing, is a static test, meaning electrical continuity between critical circuit parts are verified, but total electrical function is not determined due to time constraints and associated cost. Thermal screening is not technically feasible since there is not a thermal forcing technique available that can rapidly cycle the large mass of a four or five inch wafer. Therefore, chip integrity is still questionable after wafer probing and damage incurred during the scribing process is evaluated only by visual inspection.

Statistical sampling is another industry accepted chip test practice used to determine complete electrical functions and operating reliability, including MIL-SPEC temperature ranges. Under this methodology, one to two percent of the individual chips are separated from the wafer and mounted into a custom test fixture and subjected to dynamic electrical and thermal evaluation. Based upon the compiled test results, predicitions are made concerning the other 98 to 99 percent of chips. The chips which are used for test purposes are not usable after mounting in the test fixture.

Therefore, for the most part, chip reliability is unknown until they are assembled into the final electrical package (usually a Hybrid Microelectronic Assembly, (HMA) which is used extensively in military and space applications), and the completed HMA package is subject to MIL-SPEC final test. At this point in the manufacturing process non-functional HMA packages must undergo labor intensive troubleshooting to determine the cause of failure, and the faulty chips must be removed and replaced per MIL-SPEC procedures. In many cases the cost of repairing a faulty HMA package exceeds the cost of producing the entire package.

Accordingly, it is an object of this invention to provide a thermal test chamber device that has both the electrical testing and thermal cycling built into in a common unit so as to enable a single semiconductor chip to be both electrically and thermally subjected to test at the same time.

Another object of this invention is to provide a device that has the capability of quickly cycling a semiconductor chip from a predetermined elevated temperature to a much lower temperature in a short time span.

Another object of this invention is to provide a thermal test chamber device that has ample capacity for injecting heating or cooling directly onto the test specimen and with sufficient exhaust means to cause the test specimen to be cycled to the desired temperature quickly.

A still further object of this invention is to provide a simple thermal testing device which enables a very accurate test of both the electrical circuits of a semiconductor microchip as well as testing of the circuits at lowered and elevated temperatures.

Still a further object of this invention is to provide a thermal test chamber device that has a window in the top thereof to enable viewing of the specimen to be tested and test prongs that engage the specimen.

Others objects and advantages of this invention will be obvious to those skilled in this art.

SUMMARY OF THE INVENTION

In accordance with the invention, a thermal test chamber device is provided by upper and lower structures that define a chamber there between with the upper structure having an inlet opening for fluid to be injected there into and with means for exhausting fluid from the test chamber. The test chamber also has in the upper structure a viewing window and the lower structure has test circuit means mounted relative thereto with an opening through which a semiconductor chip can be positioned relative to leads of the circuits to enable electric circuits of a chip to be tested at the same time the chip is being heated or cooled by fluid being supplied at the inlet port and onto the chip.

DESCRIPTION OF THE PREFERRED EMBODIMENT

Figure 1:
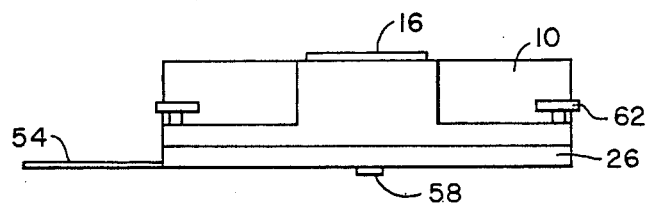
FIG. 1 is a side view of a thermal test chamber device in accordance with this invention.
Figure 2:
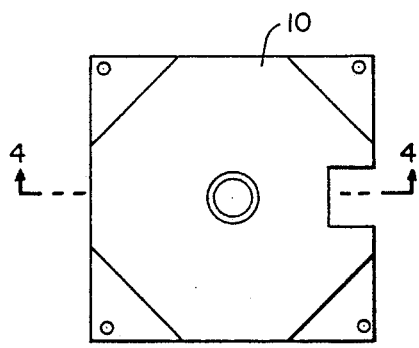
FIG. 2 is a top view of an upper section of the device in accordance with this invention.
Figure 3:
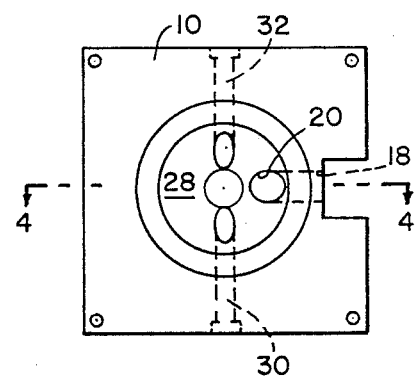
FIG. 3 is a bottom view of the top section illustrated in FIG. 2.
Figure 4:
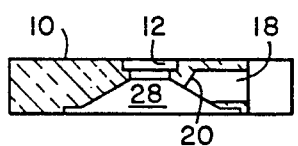
FIG. 4 is a sectional view along line 4—4 of FIG. 2 or FIG. 3.
Figure 5:
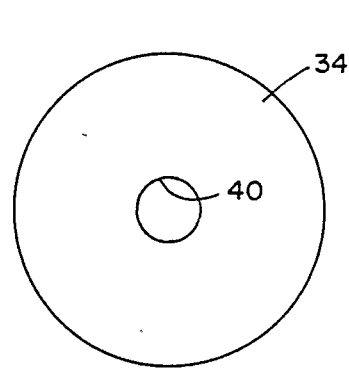
FIG. 5 is a top view of a seal used in applicants' invention.
Figure 6:
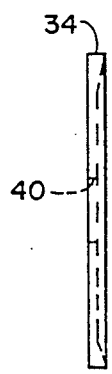
FIG. 6 is a side view of the seal illustrated in FIG. 5.
Figure 7:
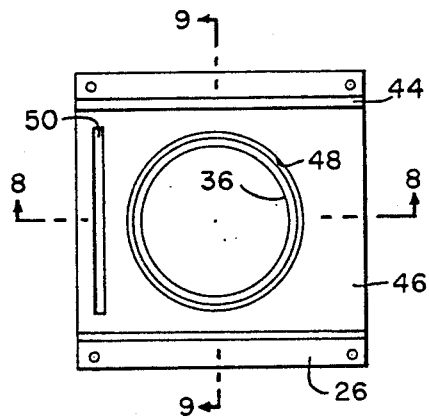
FIG. 7 is a bottom view of a lower section of the thermal test chamber device in accordance with this invention.
Figure 9:
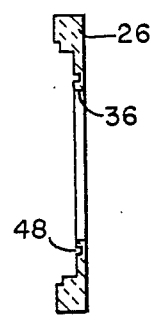
FIG. 9 is a sectional view along line 9—9 of FIG. 7.
Figure 8:
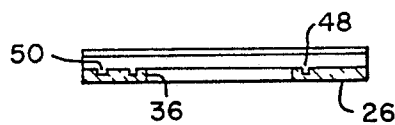
FIG. 8 is a sectional view along line 8—8 of FIG. 7.
Figure 10:
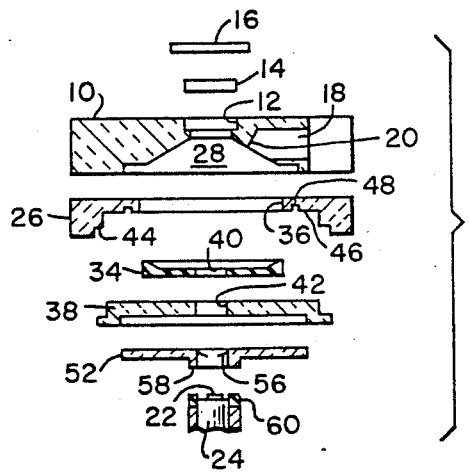
FIG. 10 is an exploded view illustrating the various parts in an unassembled condition of the device in accordance with this invention.

Referring now to the drawings, a thermal test chamber device in accordance with this invention is illustrated in a side view in FIG. 1 and in an exploded view in FIG. 10 and includes an upper half 10 that has an opening 12 for receiving a lens 14 and a retaining ring 16 mounted in a conventional manner relative to upper half 10 to secure lens 14 in place. Upper half 10 has an inlet opening 18 that has an outlet 20 that projects downwardly to direct its heating or cooling medium toward a test specimen 22 on holder 24. The details of the test specimen and holder are illustrated in more particulars in applicants' co-pending application Ser. No. 263,305 now U.S. Pat. No. 4,881,411. Upper half 10 forms with lower half 26 a chamber 28 into which the heating or cooling medium is introduced. Chamber 28 has two exhaust passages 30 and 32 therefrom as illustrated in FIG. 3 with the area for volume flow through outlets 30 and 32 being less than the area of volume flow through inlet opening 18. A seal 34 of rubber is mounted in opening 36 through lower half 26. Seal 34 seals lower half 26 relative to mother board 38 except for openings 40 and 42 in members 34 and 38. Lower half 26 has a stepped cutout portion 44 as illustrated in FIGS. 7 and 10. Lower half 26 has a flat surface 46 with a ring shaped groove 48 and a rectangular groove 50. Grooves 48 and 50 are present to accommodate projections on mother board 38 that are not illustrated. Mother board 38 is a common printed circuit type board with multiple leads which inter-connect with leads of probe card. 52 and to lead connections 54 at one end of mother board 38 as illustrated in FIG. 1. Mother board 38 is connected to stepped cutout 44 of lower half 26 in a conventional manner such as by having screws connecting it to lower half 26. Circular probe card 52 is also connected to mother board 38 in a conventional manner such as by screws. Probe card 52 has a multiplicity of circuits and a multiplicity of electrical probe leads 56 that are designed to contact specific test leads or pads of test specimen 22. Probe card 52 has a ring shaped portion 58 that is designed to be sealably contacted by rubber seal 60 to seal the openings from mother board 38 and probe card 52 relative to holder 24. Probe card 52 and mother board 38 are basically made of substrate materials that are of electrical insulating quality. Upper housing half 10 and lower housing half 26 are made of good thermal insulating materials such as Textolite. As illustrated in FIG. 1, upper half 10 and lower half 26 are secured together by screw means 62.

In operation, with the thermal test chamber device assembled as illustrated in FIG. 1 and with a chip test specimen presented at ring 58, the heating and cooling medium is presented through opening 18 directly onto the test specimen to heat or cool the test specimen as desired and with the specific arrangement disclosed by applicant, the test specimen can be quickly, in a few seconds, cycled from a temperature of about 25 degrees Celsius to minus 55 degrees Celsius or from minus 55 degrees Celsius to 125 degrees Celsius. This is accomplished by providing the appropriate heating or cooling means to inlet 18. Also with the test specimen in the heated or cooled condition and with the test specimen in contact with probes 56, electrical circuit tests can be performed on the chip specimen at the desired temperature of the chip.

We claim:

1. A thermal test chamber device comprising upper and lower halfs defining a housing with a chamber therein, said upper housing half having an inlet port therein for injecting conditioning medium into said chamber, and outlet means for exhausting said medium, said lower housing half having a central opening therethrough with seal means mounted relative thereto with an opening through the seal means, and circuit means mounted to said lower housing half at a lower surface thereof and with said seal means sealing said lower housing half relative to said circuit means, said circuit means having opening means therethrough and aligned with said opening through said seal means and test probes projecting into said aligned opening means of said circuit means for engagement of said test probes with a test specimen.

2. A thermal test chamber device as set forth in claim 1, wherein said inlet directs its medium directly onto said test probes and said outlet means from said chamber includes a plurality of outlets with the area for volume flow through said outlets being less than the area volume flow through said inlet.

3. A thermal test chamber device as set forth in claim 1, wherein said upper housing half has a central opening at a top surface thereof with a window mounted relative thereto for enabling one to view through said window and into said chamber to view the test specimen.

4. A thermal test chamber device as set forth in claim 1, wherein said circuit means includes a mother board with a plurality of test leads at one end of said mother board and a probe card that contains circuits and said test probes and being mounted relative to said mother board with the circuits of the probe card and the mother board being inter-connected for making electrical test.

5. A thermal test chamber device as set forth in claim 1, wherein said inlet port injects its medium directly through the opening in said seal and onto said test probes.

6. A thermal test chamber device as set forth in claim 4, wherein said probe card has a ring shaped portion at one side for sealing relative to a test holder for the specimen.

* * * * *